(12) United States Patent
Hashimoto et al.

(10) Patent No.: US 10,553,765 B2
(45) Date of Patent: Feb. 4, 2020

(54) METHOD FOR MANUFACTURING LIGHT EMITTING DEVICE

(71) Applicant: NICHIA CORPORATION, Anan-shi, Tokushima (JP)

(72) Inventors: Toru Hashimoto, Tokushima (JP); Takahiro Amo, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/785,877

(22) Filed: Oct. 17, 2017

(65) Prior Publication Data

US 2018/0145232 A1    May 24, 2018

(30) Foreign Application Priority Data

Nov. 21, 2016    (JP) .................. 2016-225672

(51) Int. Cl.
| | | |
|---|---|---|
| *H01L 33/62* | (2010.01) | |
| *H01L 33/50* | (2010.01) | |
| *H01L 33/48* | (2010.01) | |
| *H01L 33/56* | (2010.01) | |
| *H01L 33/54* | (2010.01) | |
| *H01L 33/60* | (2010.01) | |

(52) U.S. Cl.
CPC .......... *H01L 33/505* (2013.01); *H01L 33/486* (2013.01); *H01L 33/56* (2013.01); *H01L 33/62* (2013.01); *H01L 33/54* (2013.01); *H01L 33/60* (2013.01); *H01L 2933/005* (2013.01); *H01L 2933/0041* (2013.01); *H01L 2933/0058* (2013.01); *H01L 2933/0066* (2013.01)

(58) Field of Classification Search
CPC combination set(s) only.
See application file for complete search history.

(56) References Cited

U.S. PATENT DOCUMENTS

| | | |
|---|---|---|
| 2007/0029569 A1 | 2/2007 | Andrews |
| 2009/0186454 A1 | 7/2009 | Miyawaki et al. |
| | (Continued) | |

FOREIGN PATENT DOCUMENTS

| | | |
|---|---|---|
| CN | 201536114 U | 7/2010 |
| CN | 201802795 U | 5/2011 |
| | (Continued) | |

*Primary Examiner* — Moazzam Hossain
*Assistant Examiner* — Hajar Kolahdouzan
(74) *Attorney, Agent, or Firm* — Global IP Counselors, LLP

(57) ABSTRACT

A method for manufacturing a light emitting device includes: providing a substrate; placing a light emitting element on a top surface of the substrate; arranging on the top surface of the substrate a translucent frame body that is spaced apart from the light emitting element and that surrounds the light emitting element so that a top surface of the translucent frame body is at a position higher than a top surface of the light emitting element; arranging a wavelength conversion member in a region surrounded by the translucent frame body so as to cover the top surface and a side surface of the light emitting element and to be in contact with an inside surface of the frame body; and forming a translucent member that covers the substrate, the translucent frame body, and the wavelength conversion member.

13 Claims, 8 Drawing Sheets

(56) References Cited

U.S. PATENT DOCUMENTS

| | | | |
|---|---|---|---|
| 2012/0098001 | A1 | 4/2012 | Cheng |
| 2012/0273813 | A1 | 11/2012 | Jung |
| 2014/0124812 | A1* | 5/2014 | Kuramoto ............... H01L 33/54 |
| | | | 257/98 |

FOREIGN PATENT DOCUMENTS

| | | | |
|---|---|---|---|
| CN | 201820793 | U | 5/2011 |
| CN | 102456819 | A | 5/2012 |
| CN | 202352723 | U | 7/2012 |
| JP | 2005-123560 | A | 5/2005 |
| JP | 2006-049524 | A | 2/2006 |
| JP | 2007-080875 | A | 3/2007 |
| JP | 2007-150228 | A | 6/2007 |
| JP | 2009-503888 | A | 1/2009 |
| JP | 2009-200465 | A | 9/2009 |
| JP | 2011-009635 | A | 1/2011 |
| JP | 2011-114222 | A | 6/2011 |
| JP | 2012-015320 | A | 1/2012 |
| JP | 2013-149637 | A | 8/2013 |
| JP | 2014-017375 | A | 1/2014 |
| JP | 2014-022435 | A | 2/2014 |
| JP | 2014-127636 | A | 7/2014 |
| JP | 2014-241456 | A | 12/2014 |
| JP | 2015-026778 | A | 2/2015 |
| JP | 2015-070126 | A | 4/2015 |
| JP | 2015-099912 | A | 5/2015 |
| JP | 2016-072263 | A | 5/2016 |
| JP | 2016-086022 | A | 5/2016 |
| JP | 2016-115897 | A | 6/2016 |
| WO | 2012-157644 | A1 | 11/2012 |

\* cited by examiner

METHOD FOR MANUFACTURING LIGHT EMITTING DEVICE

CROSS REFERENCE TO RELATED APPLICATIONS

This application claims priority to Japanese Patent Application No. 2016-225672 filed on Nov. 21, 2016. The entire disclosure of Japanese Patent Application No. 2016-225672 is hereby incorporated herein by reference.

TECHNICAL FIELD

The present invention relates to a method for manufacturing a light emitting device.

BACKGROUND ART

Light emitting devices (light emitting diodes) provided with a semiconductor light emitting element (hereafter, light emitting element) and a phosphor are known. Arranging the phosphor so as to cover the light emitting element using an electrodeposition method or the like, for example, is known (Japanese Laid-Open Patent Publication No. 2011-9635, for example). The phosphor layer formed using the electrodeposition method can have an approximately even thickness on the top surface and the side surface of the light emitting element. Because of that, it is easy to have even chromaticity of the light emitted in the side surface direction and the light emitted in the top surface direction of the light emitting element, thus having a light emitting device with little light distribution color unevenness.

SUMMARY

The electrodeposition method requires stricter management of steps compared to other methods such as potting, etc. Because of that, there is demand for a method of forming the wavelength conversion layer with even thickness on the surface of the light emitting element using a simpler method.

Embodiments of the present invention include the following configuration.

A method for manufacturing a light emitting device includes: providing a substrate; placing a light emitting element on a top surface of the substrate; arranging on the top surface of the substrate a translucent frame body that is spaced apart from the light emitting element and that surrounds the light emitting element so that a top surface of the translucent frame body is at a position higher than a top surface of the light emitting element; arranging a wavelength conversion member in a region surrounded by the translucent frame body so as to cover the top surface and a side surface of the light emitting element and to be in contact with an inside surface of the frame body; and forming a translucent member that covers the substrate, the translucent frame body, and the wavelength conversion member.

Based on the above, it is possible to easily form a wavelength conversion member of an approximately even thickness on the surface of the light emitting element.

DETAILED DESCRIPTION OF EMBODIMENTS

Figure 1A:
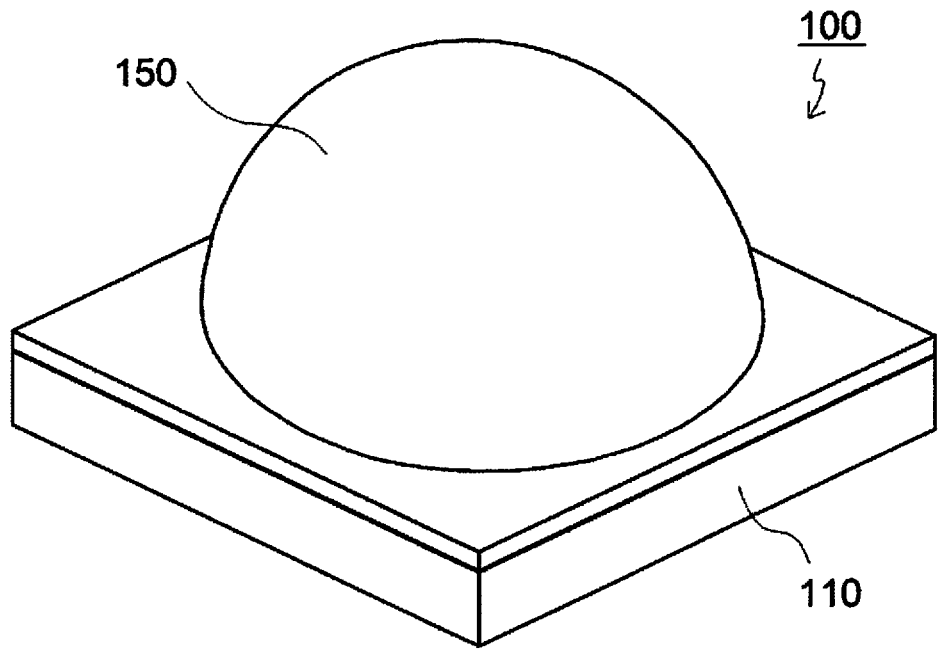
FIG. 1A is a schematic perspective view of a light emitting device obtained using the manufacturing method of an embodiment.

Modes for carrying out the present invention are explained hereafter while referring to the drawings. However, the modes shown hereafter show examples of the method for manufacturing the light emitting device for embodying the technical concept of the present invention, and the invention is not limited to the following. Also, unless specifically noted, the scope of the present invention is not limited only to the dimensions, materials, shape, and relative arrangement, etc., of the constituent components noted in the embodiments. Note that the size and positional relationship, etc. of the members shown in each drawing may be exaggerated to make the explanation clearer. Also, terms for indicating specific directions and positions are used as necessary (for example, "top," "bottom," "left," "right," and other terms including those terms). The use of these terms is to make it easier to understand the invention with reference to the drawings, and the technical scope of the present invention is not limited by the meaning of these terms.

The method for manufacturing the light emitting device of the present invention is provided with a step of forming a frame body that surrounds the light emitting element placed on the top surface of the substrate, and forming a wavelength conversion member within that frame body. By providing this kind of frame body, the wavelength conversion member that covers the side surface of the light emitting element is formed in a limited region between the frame body and the light emitting element. Also, the wavelength conversion member that covers the top surface of the light emitting element has its thickness controlled by the frame body having the top surface at a higher position than the top surface of the light emitting element. In other words, it is possible to control the thickness of the wavelength conversion member that covers the light emitting element using the frame body. By using such a method, as with the wavelength conversion member formed using the electrodeposition method, it is possible to make the thickness of the wavelength conversion member that covers the side surface and the top surface of the light emitting element approximately even. Also, since the frame body is translucent, it is possible for light emitted at the side of the light emitting element to be transmitted through the frame body. It is thereby possible to easily obtain the light emitting device with little light distribution color unevenness.

Also, with the electrodeposition method, work is performed in an electrodeposition bath liquid. Because of that, depending on the composition of the phosphor contained in the wavelength conversion member, there are cases when the electrodeposition method cannot be used. With the present embodiment, the wavelength conversion member is formed with phosphor contained in an uncured resin material, so it is possible to use a phosphor that is unsuitable for the electrodeposition method.

Embodiment 1

Figure 1B:
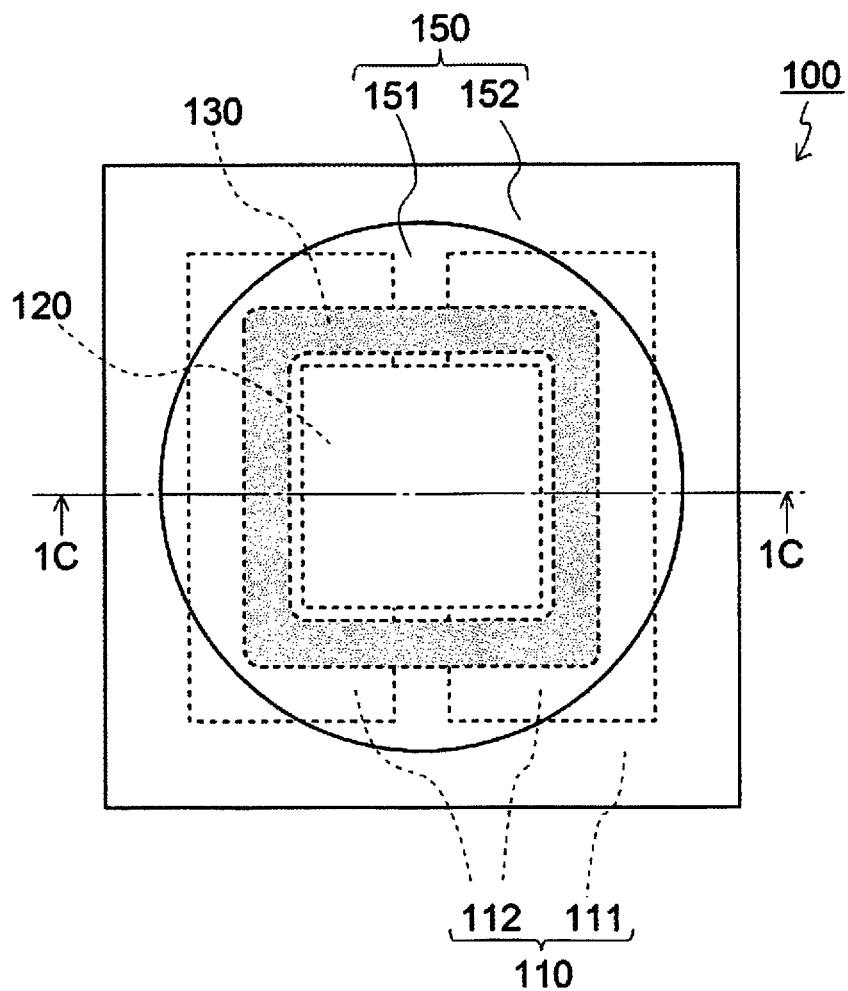
FIG. 1B is a schematic top view showing the interior of the light emitting device shown in FIG. 1A in a see-through state.
Figure 1C:
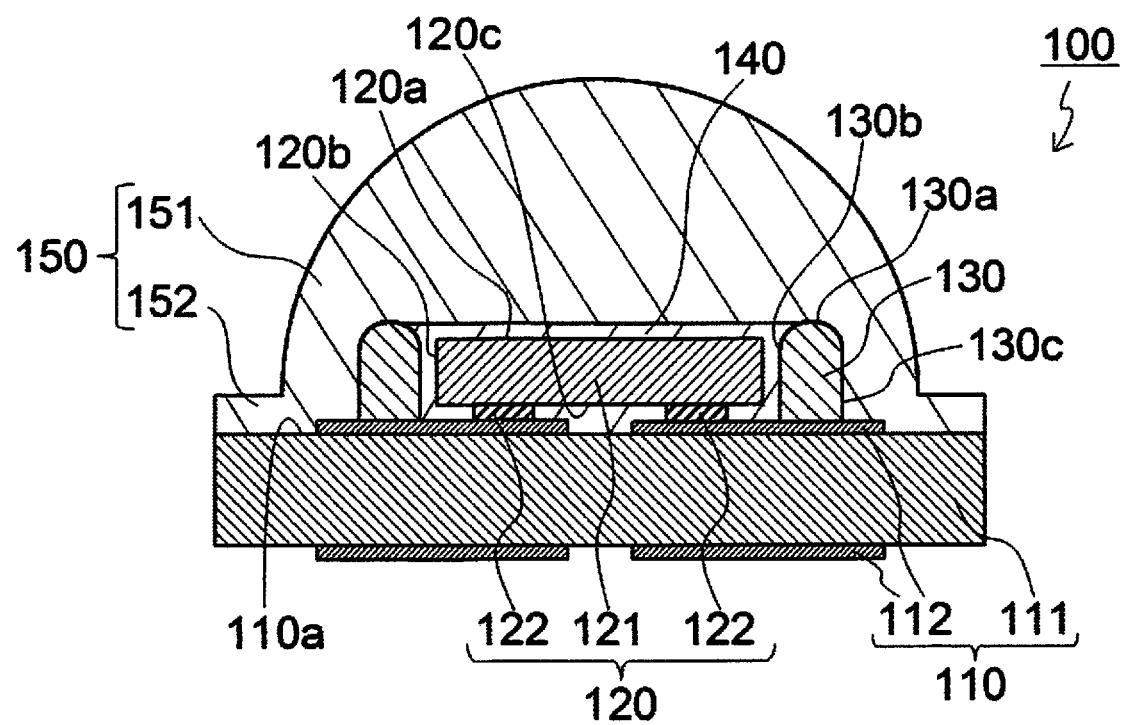
FIG. 1C is a schematic cross section view of line 1C-1C in FIG. 1B.

FIG. 1A to FIG. 1C show a light emitting device obtained using the manufacturing method according to Embodiment 1. FIG. 2A to FIG. 2G show the method for manufacturing the light emitting device 100. The light emitting device 100 is provided with a substrate 110, a light emitting element 120, a frame body 130, a wavelength conversion member 140, and a translucent member 150. More specifically, the substrate 110 is provided with an insulating base material 111, and a pair of conductive members 112 provided on at least the top surface of the base material 111. The light emitting element 120 is placed on the top surface of the pair of conductive members 112. The light emitting element 120 is provided with a pair of electrodes 122 on a bottom surface 120c. The electrodes 122 of the light emitting element 120 and the conductive members 112 of the substrate 110 are electrically connected.

The frame body 130 that surrounds the light emitting element 120 is arranged on a top surface 110a of the substrate 110. The frame body 130 is translucent. The frame body 130 is separated from the light emitting element 120. A top surface 130a of the frame body 130 is at a position higher than a top surface 120a of the light emitting element 120.

The wavelength conversion member 140 is arranged in the region surrounded by the frame body 130. The wavelength conversion member 140 covers the top surface 120a and a side surface 120b of the light emitting element 120. The wavelength conversion member 140 is in contact with an inside surface 130b of the frame body 130. Furthermore, on the top surface 110a of the substrate 110, the translucent member 150 that covers the frame body 130 and the wavelength conversion member 140 is provided.

Following is a detailed description regarding each step. In FIG. 2A to FIG. 2G, with a substrate 1100, an example is shown of the method for obtaining two light emitting devices. The number of light emitting devices is not limited to this, and can be selected freely.

Step for Preparing the Substrate

Figure 2A:
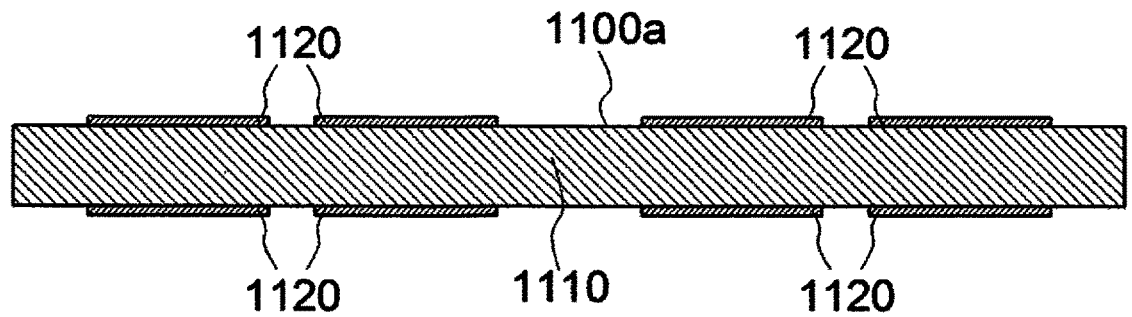
FIG. 2A is a schematic cross section view for explaining the method for manufacturing the light emitting device of the embodiment.

The substrate 1100 is prepared as shown in FIG. 2A. Conductive members 1120 are provided on a top surface 1100a of the substrate 1100. The conductive members 1120 function as electrodes for supplying electricity to the light emitting element, and a pair that are positive and negative electrodes is provided on the top surface 1100a of the substrate 1100. Here, because two light emitting devices are shown as an example, two pairs of conductive members 1120 are provided. The conductive members 1120 provided on the top surface of the substrate 1100 can also be made to function as external connection terminals.

The conductive members 1120 can also be provided on the bottom surface of the substrate 1100. The bottom surface conductive members 1120 are useful as external connection terminals when mounting using solder, etc. on a secondary substrate or the like, for example. The conductive members 1120 of the top surface 1100a of the substrate 1100 and the conductive members 1120 of the bottom surface of the substrate 1100 can be electrically connected using vias or the like, for example. Also, for the conductive members, in addition to conductive members that contribute to supplying electricity to the light emitting element as described above, it is also possible to provide conductive members that are not made electrically conductive. Such conductive members can be made to function as heat dissipation members, and can also be made to function as recognition members of cathode marks or the like.

Step for Placing the Light Emitting Element on the Top Surface of the Substrate

Figure 2B:
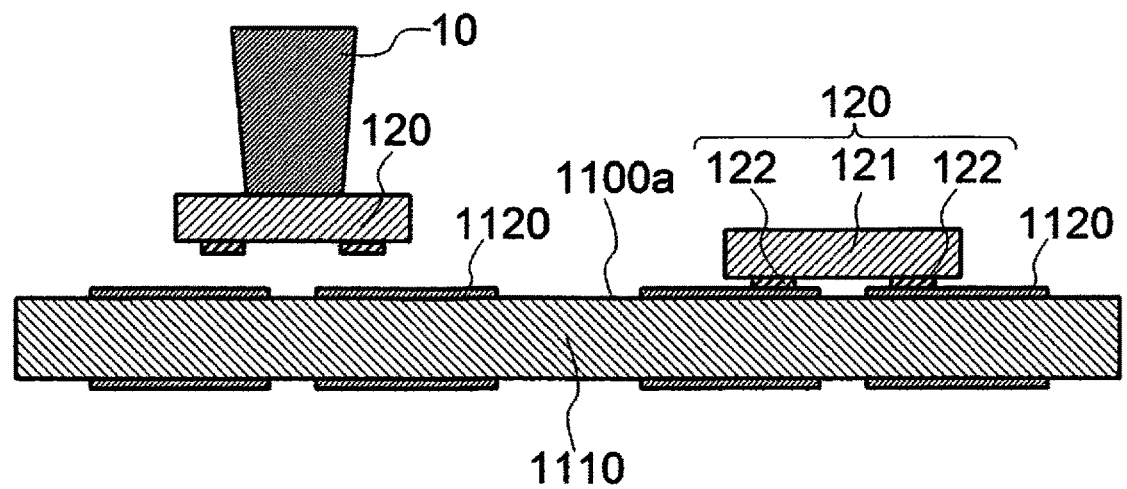
FIG. 2B is a schematic cross section view for explaining the method for manufacturing the light emitting device of the embodiment.

The light emitting element 120 is placed on the top surface 1100a of the substrate 1100 as shown in FIG. 2B. This step can be performed using a die bond device, for example. In this case, the light emitting element 120 is set in the die bond device in a state stuck to a wafer sheet or the like, and the substrate 1100 is also set in the same die bond device. The die bond device is provided with a collet which is has a suction function, and the light emitting element 120 is removed from the wafer sheet using the collet. Then, as shown in FIG. 2B, the collet 10 that suctioned the light emitting element 120 is moved to a prescribed position of the top surface 1100a of the substrate 1100. On the top surface of the conductive members 1120 of the top surface 1100a of the substrate 1100, a joining member is formed in advance, and after abutting the light emitting element 120 on that joining member, the suction of the collet 10 is released. The light emitting element is thereby placed on the top surface of the substrate 1100. At that time, ultrasonic waves, heat, pressure or the like can be applied. Also, rather than using a collet, for example, it is also possible to place the light emitting element on the top surface of the substrate using a method such as transferring a wafer sheet on which a plurality of light emitting elements are arranged at prescribed intervals, with the surface on which the light emitting elements are arranged and the top surface of the substrate facing opposite.

The light emitting element 120 is provided with a laminated structure 121 which is provided with an insulating substrate such as a sapphire substrate and a semiconductor layer including a light emitting layer, and a pair of electrodes 122 formed on the semiconductor layer, for example. When placing the light emitting element 120 on the top surface 1100a of the substrate 1100, in FIG. 2B, an example is shown for which the collet 10 suctions the surface on the laminated structure 121 side. It is thereby possible to do so-called flip-chip mounting, with which the surface of the side on which the electrodes 122 are formed (electrode forming surface) is faced opposite the top surface 1100a of the substrate 1100, and the laminated structure 121 side is made to be the top side. In this case, an electrically conductive joining member is used as the joining member.

One or a plurality of two or more light emitting elements can be placed on one light emitting device. When placing a plurality of light emitting elements, light emitting elements which all have the same light emitting wavelength can be used, or light emitting elements of different light emitting wavelengths can be used. For example, one or a plurality of blue light emitting elements can be placed, or blue light emitting elements and green light elements can be placed. Red light emitting elements and ultraviolet light emitting elements can also be placed. Also, when a plurality of blue light emitting elements are placed, it is possible to use light emitting elements of respectively the same or different light emission peak wavelengths. Also, in addition to the light emitting elements, it is also possible to place a protection element such as a Zener diode or the like.

Step of Forming the Frame Body

The translucent frame body 130 is formed on the top surface 1100a of the substrate 1100. The frame body 130 is formed so as to surround the light emitting element 120. The frame body 130 is formed so as to be separated from the side surface 120b of the light emitting element 120. At that time, it is preferable to do formation so that the distance between the side surface 120b of the light emitting element and the inside surface 130b of the frame body 130 are approximately constant. It is preferable that the shape of the outer periphery of the light emitting element 120 and the shape of the inside surface of the frame body 130 in the top view are approximately the same shape. For example, as shown in FIG. 1C, when using the light emitting element 120 with an approximately square shape in the top view, it is preferable to form the frame body 130 to also have an approximately square shape in the top view. It is also preferable to have the center of the light emitting element and the center of the frame body be in the same position. It is thereby possible to have the thickness of the wavelength conversion member that covers each side surface of the light emitting element 120 be approximately equal.

A plurality of light emitting elements can be provided on one light emitting device. In that case, all the light emitting elements are regarded as one light emitting element, and the frame body is formed so as to enclose all the light emitting elements. Also, the frame body is such that the top surface of the frame body is positioned at a position higher than the top surface of all the light emitting elements.

The inside surface 130b of the frame body 130 is preferably made to be approximately parallel to the side surface 120b of the light emitting element 120. It is thereby possible to make the thickness of the wavelength conversion member covering the side surface 120b of the light emitting element 120 approximately even in the height direction of the light emitting element 120. For example, when the side surface 120b of the light emitting element 120 is approximately perpendicular to the top surface 1100a of the substrate 1100, it is preferable that the inside surface 130b of the frame body 130 also be approximately perpendicular to the top surface 1100a of the substrate 1100.

The top surface 130a of the frame body 130 is formed so as to be at a position higher than the top surface 120a of the light emitting element 120. The top surface 130a of the frame body 130 can be a flat surface, or it can be a curved surface as shown in FIG. 1C. When the top surface 130a of the frame body is curved, the position of its topmost edge is made to be higher than the top surface 120a of the light emitting element 120.

Also, the distance between the side surface 120b of the light emitting element 120 and the inside surface 130b of the frame body 130, and the difference of elevation between the top surface 130a of the frame body and the top surface 120a of the light emitting element are made to be approximately equal. Working in this way, it is possible to have the thickness of the wavelength conversion member that covers the top surface and the side surface of the light emitting element be approximately equal. Here, "approximately equal" means a tolerance of approximately ±10% is allowed.

For example, a light emitting element with a top view square shape of 1000 μm×1000 μm, and height of approximately 100 μm is used. Then, in the periphery of such a light emitting element 120, the frame body 130 for which the inner circumference shape in the top view is square is formed at a height of approximately 120 μm. The region surrounded by the frame body 130 is a square shape for which the length of one side is 1040 μm, and the light emitting element 120 is arranged at the center of this region. The distance between the inside surface of the frame body 130 and the side surface of the light emitting element 120 is 20 μm, and the difference of elevation of the frame body 130 and the light emitting element 120 is 20 μm. Also, the wavelength conversion member 140 is formed in this kind of region surrounded by the frame body 130. The wavelength conversion member 140 that covers the top surface 120a and the side surface 120b of the light emitting element 120 can both be 20 μm.

Figure 2C:
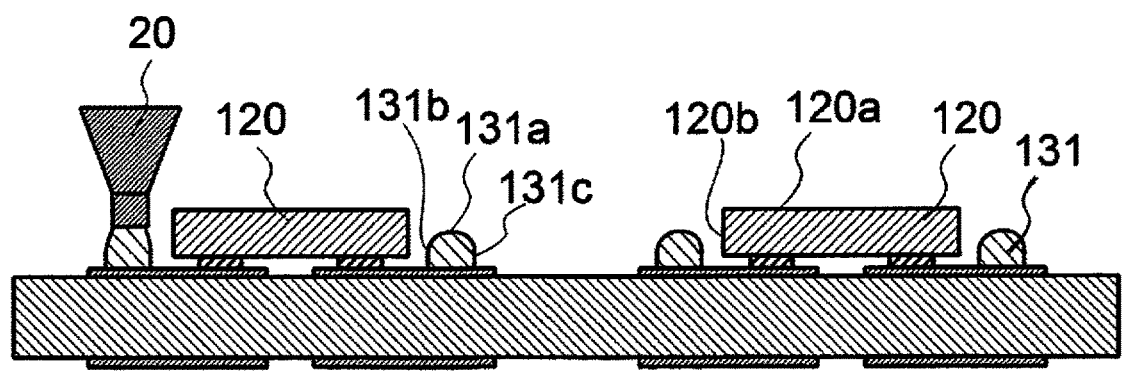
FIG. 2C is a schematic cross section view for explaining the method for manufacturing the light emitting device of the embodiment.

The kind of frame body 130 described above can be formed using a dispensing nozzle 20 such as that shown in FIG. 2C, for example. More specifically, it is possible to form the frame body 130 by moving the dispensing nozzle 20 above the periphery of the light emitting element 120 while uncured resin material in a liquid form or paste form is discharged from the nozzle, and curing the resin material by heating or the like after supplying it in a frame shape on the top surface 1100a of the substrate 1100.

For the frame body 130, when supplying using the kind of drawing method described above by which uncured resin material is discharged while moving the dispensing nozzle 20, it is possible to use a dispensing nozzle provided with an opening part such as a circle, an oval, a square, a polygon, etc., as the discharge port at the center of the tip of the dispensing nozzle. It is also possible to use a dispensing nozzle provided with a frame shaped discharge port as the discharge port of the dispensing nozzle. In this case, rather than supplying the uncured resin material while moving, it is possible to perform supplying while keeping still. It is also possible to supply the uncured resin material by print coating using a mask.

In this way, when the frame body is formed by supplying uncured resin material to the top surface of the substrate, and curing by heating, the step of heating to cure the frame body is preferably performed at a temperature that is lower than the heating temperature when curing the wavelength conversion member described later. For example, by heating at approximately 100° C. to 150° C. after forming uncured resin material into a frame shape, the frame body is in a temporary cured (semi-cured) state. A temporary cured state is a state of curing to the degree that the frame body does not deform. After that, the wavelength conversion member is formed in the region surrounded by the frame body, and by heating at approximately 100° C. to 150° C., both the frame body and the wavelength conversion member are fully cured. In this way, after forming the uncured resin material into a frame shape, when a plurality of heating steps are performed, by having a portion of the heating steps be a heating step at a low temperature (temporary curing step), it is possible to suppress excessive heat being applied to the frame body.

When forming the frame body using uncured resin material, by adjusting the viscosity, etc., it is possible to adjust the width and height. The frame body can be formed so as to have the dispensing nozzle make a circle around the periphery of the light emitting element once to be formed higher than the top surface of the light emitting element. Alternatively, it is also possible to move the dispensing nozzle around the periphery of the light emitting element twice, to be formed with a plurality of frame bodies overlapped.

Figure 2D:
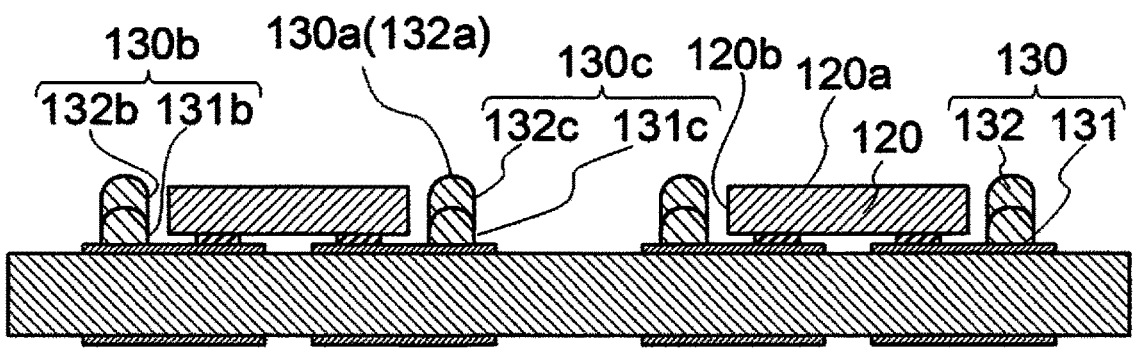
FIG. 2D is a schematic cross section view for explaining the method for manufacturing the light emitting device of the embodiment.

FIG. 2C and FIG. 2D show steps for forming the frame body 130. Here, after a first frame body 131 is formed, by forming a second frame body 132 so as to overlap that first frame body 131, one frame body 130 is formed. By forming by overlapping a plurality of frame bodies in this way, it is possible to form a frame body with narrow width in the cross section view to a desired height. In FIG. 1C, etc., for the frame body 130, the boundary of the first frame body and the second frame body is not illustrated. In other drawings as well, even when a plurality of frame bodies are layered, there are cases when their boundaries are not illustrated.

When forming the frame body by layering, in addition to a two-layer structure for which two frame bodies are layered as shown in FIG. 2D, it is also possible to use a layered structure of a plurality of three or more frame bodies. When using a layered structure frame body, it is sufficient that the topmost surface of the layered frame bodies be at a position higher than the top surface of the light element. As shown in FIG. 2C for example, the top surface 131a of the first frame body 131 is at a position lower than the top surface 120a of the light emitting element 120. Also, as shown in FIG. 2D, the second frame body 132 is formed on the first frame body 131. The top surface 132a of the second frame body 132 becomes the top surface 130a of the frame body 130, and is at a position higher than the top surface 120a of the light emitting element 120. The inside surface 130b of the frame body 130 is configured by the inside surface 131b of the first frame body 131 and the inside surface 132b of the second frame body 132. The outside surface 130c of the frame body 130 is configured by the outside surface 131c of the first frame body 131 and the outside surface 132c of the second frame body 132. By supplying the first frame body 131 and the second frame body 132 to have the same width, it is possible to form the inside surface 130b and the outside surface 130c of the frame body 130 to be approximately perpendicular to the top surface 1100a of the substrate 1110.

Also, in addition to forming the frame body by curing resin material in an uncured state on a substrate as described above, it is also possible to form a frame body by sticking a molded frame body, said another way, a frame body in a cured state, onto the substrate using an adhesive agent or the like. For example, it is possible to stick a frame body formed by punching a translucent sheet to frame shape or the like onto the top surface of the substrate.

As a joining member for joining the light emitting element, when using a material that requires high temperature processing, for example, when using a eutectic material requiring heating of 250° C. or greater as the joining member, it is possible that the frame body will deteriorate due to the heating step. In such a case, it is preferable to place the light emitting element first, and to form the frame body after the heating step.

Also, the frame body 130 can be formed before the step of placing the light emitting element 120. In that case, the frame body is formed so as to surround the position at which the light emitting element is to be placed. For example, when using a eutectic material that can be joined with heating at 250° C. or less, when using the frame body 130 which will not deteriorate even at that joining temperature, the frame body 130 is arranged before placing the light emitting element 120. The eutectic material (joining member) with low reflectance is thereby dammed by the frame body 130, and it is possible to suppress expansion to a broad range on the conductive member 112. Because of that, it is possible to reduce a light flux decrease, and to suppress electromigration.

Step of Forming the Wavelength Conversion Member

The wavelength conversion member 140 is formed. The wavelength conversion member 140 is formed in the region surrounded by the frame body 130. More specifically, the wavelength conversion member 140 is formed so as to cover the top surface 120a and the side surface 120b of the light emitting element 120. Furthermore, the wavelength conversion member 140 is formed so as to also be in contact with the inside surface 130b of the frame body 130.

Figure 2E:
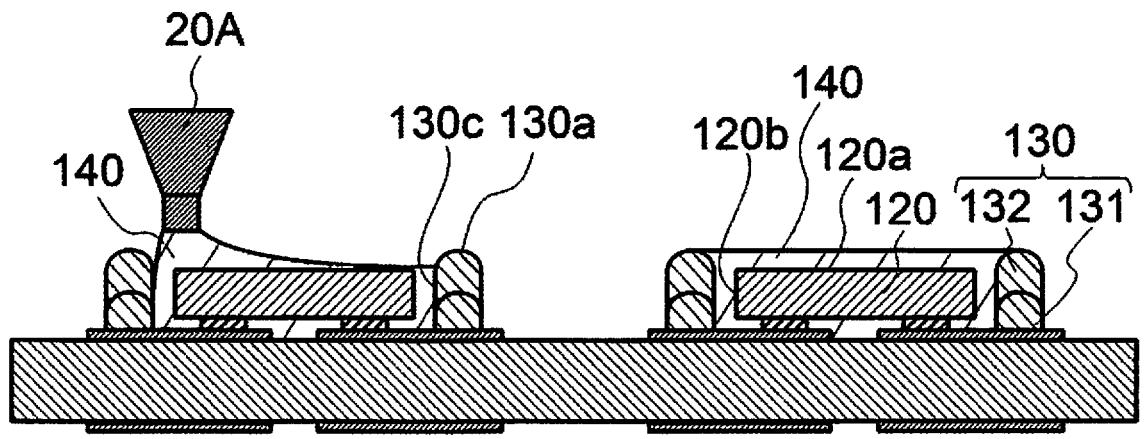
FIG. 2E is a schematic cross section view for explaining the method for manufacturing the light emitting device of the embodiment.
Figure 2F:
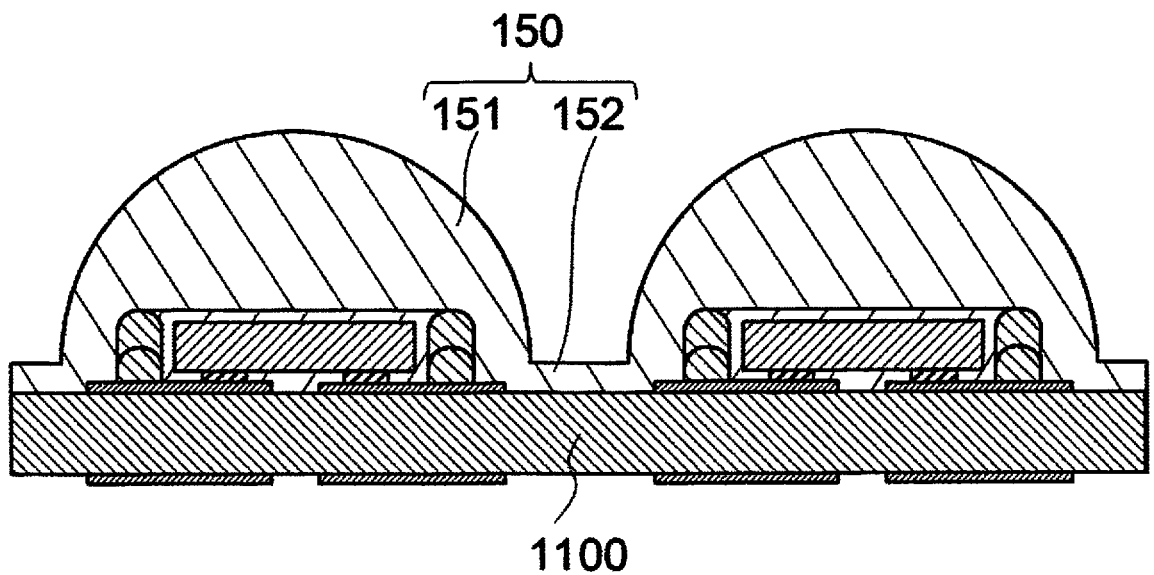
FIG. 2F is a schematic cross section view for explaining the method for manufacturing the light emitting device of the embodiment.

As shown in FIG. 2E, for the wavelength conversion member 140, the uncured wavelength conversion member 140 for which phosphor powder is mixed in uncured resin material is discharged from the dispensing nozzle 20A. The amount of the wavelength conversion member 140 is adjusted so as to be the top surface of approximately the same position as the top surface of the frame body. Also, by curing using heating, considering the fact that the volume of the uncured resin material is smaller, it is possible to form the wavelength conversion member 140 so as to be at a position higher than the top surface of the frame body. It is also possible to make the frame body higher, forming with the wavelength conversion member top surface positioned at a lower position than the top surface of the frame body.

When the top surface of the top surface 130a of the frame body 130 is a curved surface, as shown in FIG. 1B, etc., there are cases when a portion of the wavelength conversion member 140 covers the top surface 130a of the frame body 130. The thickness of the wavelength conversion member 140 in the horizontal direction becomes thicker by the amount that the top surface 130a of the frame body 130 is covered. More specifically, the wavelength conversion member 140 which is thick in the horizontal direction is arranged near the corner of the top surface of the light emitting element 120. By the thickness of the wavelength conversion member 140 being thicker than the other parts at this kind of position, it is possible to vary the light distribution color. Also, by making the frame body 130 higher, and forming the wavelength conversion member to be of a thickness at a level that does not cover the top surface 130a of the frame body, it is possible to suppress formation of this kind of thick part.

Between the bottom surface 120c of the light emitting element 120 and the top surface 110a of the substrate 110, a gap correlating to the thickness of the electrodes 122 is formed. It is also possible to form the wavelength conversion member 140 in this gap. It is thereby possible to suppress light absorption by the substrate 110, and to convert light from the light emitting element 120 with the wavelength conversion member 140.

Step of Forming the Translucent Member

The translucent member 150 is formed on the substrate 1100. The translucent member 150 can be formed using a method such as compression molding, transfer molding, etc. For example, as described previously, an intermediate body in a state with the light emitting element 120, the frame body 130, and the wavelength conversion member 140 formed on the substrate 1100 is set in a lower mold, and after the uncured translucent member is filled on the substrate, the upper mold is closed and compression molding is done.

The translucent member 150 is formed spanning approximately the entire surface of the top surface 1100a of the substrate 1100. In other words, the translucent member 150 is formed continuously on a plurality of light emitting devices. The translucent member 150 is provided with a lens part 151 and a flange part 152. The lens part 151 is a part for controlling distribution of light such as by condensing or diffusing light from the light emitting element. Aside from the convex lens such as that shown in FIG. 2F, the lens part 151 can also be a concave lens, a Fresnel lens, or the like. The flange part 152 is a translucent member formed on a part cut in a step described later. The flange part 152 is preferably made to be thin so as not to be susceptible to affecting the light distribution characteristics of the light emitting device. For example, the height of the flange part 152 is preferably lower than the height of the frame body 130. Furthermore, the height of the flange part 152 is preferably lower than the height of the light emitting element 120.

Figure 2G:
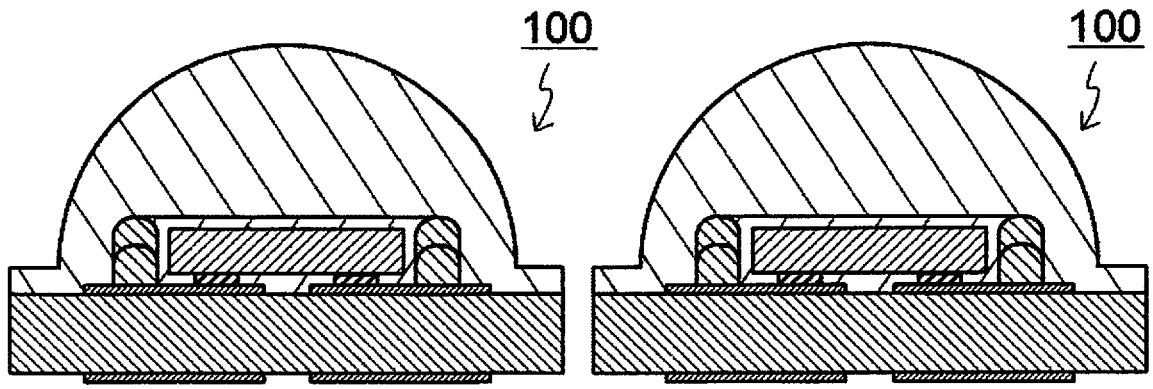
FIG. 2G is a schematic cross section view for explaining the method for manufacturing the light emitting device of the embodiment.

Finally, by cutting the flange part 152 of the translucent member 150 and the substrate 1100 below that, as shown in FIG. 2G, it is possible to obtain the divided light emitting devices 100. For the dividing method, it is possible to use a method such as laser scribing, dicing, breaking, or the like, alone or in combination.

Embodiment 2

Figure 3:
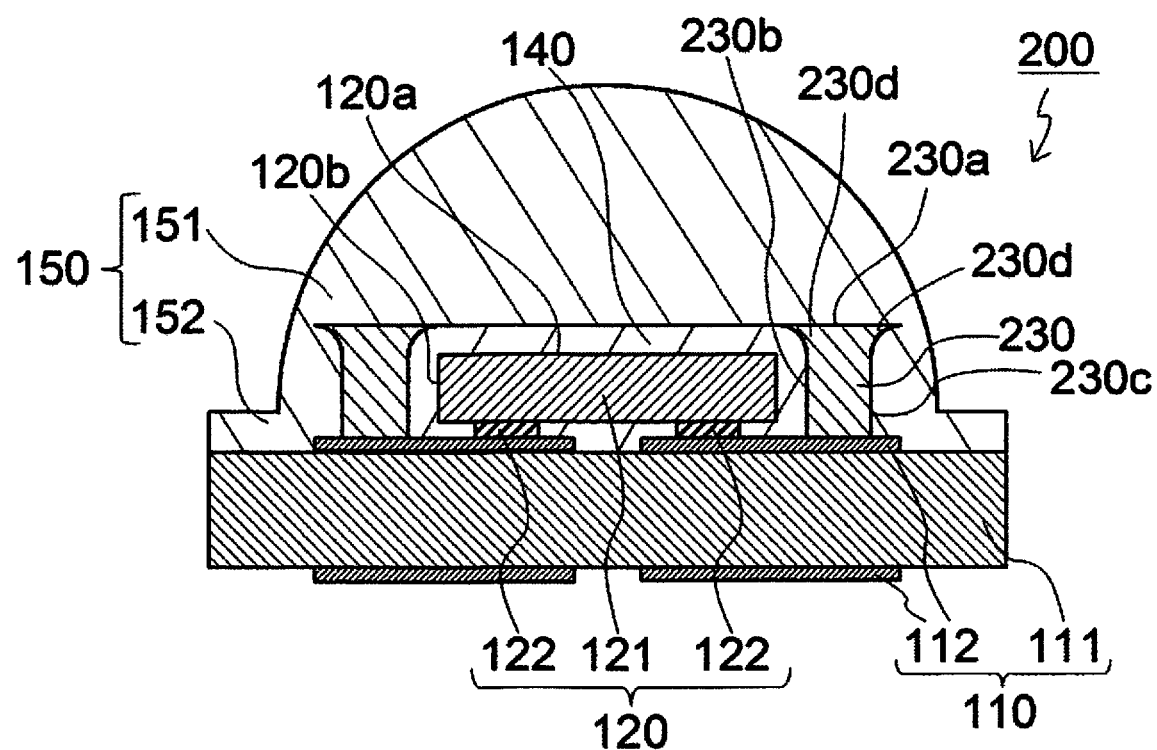
FIG. 3 is a schematic cross section view of the light emitting device obtained using the manufacturing method of an embodiment.

FIG. 3 shows a light emitting device 200 obtained with the manufacturing method according to Embodiment 2. Also, the method for manufacturing the light emitting device 200 is shown in FIG. 4A to 4D. The method for manufacturing the light emitting device according to Embodiment 2 differs from Embodiment 1 in regards to the point that in the step of forming a frame body 230, a step of having the frame body 230 deformed at the top surface of the substrate is provided. The shape of the obtained frame body 230 is also different from that of Embodiment 1.

With the light emitting device 200, the frame body 230 is arranged enclosing the light emitting element 120 on the top surface 110a of the substrate 110. The frame body 230 is translucent. The frame body 230 is separated from the light emitting element 120. A top surface 230a of the frame body 230 is in a position higher than the top surface 120a of the light emitting element 120.

With Embodiment 2, the top surface 230a of the frame body 230 is a planar shape. Also, an inside surface 230b and an outside surface 230c of the frame body 230 are respectively provided with projecting parts 230d on the top edge. Said another way, the width of the top surface 230a of the frame body 230 is broader than the width of the frame body 230 positioned lower than that. The projecting parts 230d respectively have a curved surface for the lower surface. The frame body 230 provided with this kind of projecting part 230d can be formed using the method shown in FIG. 4A to FIG. 4D.

Figure 4A:
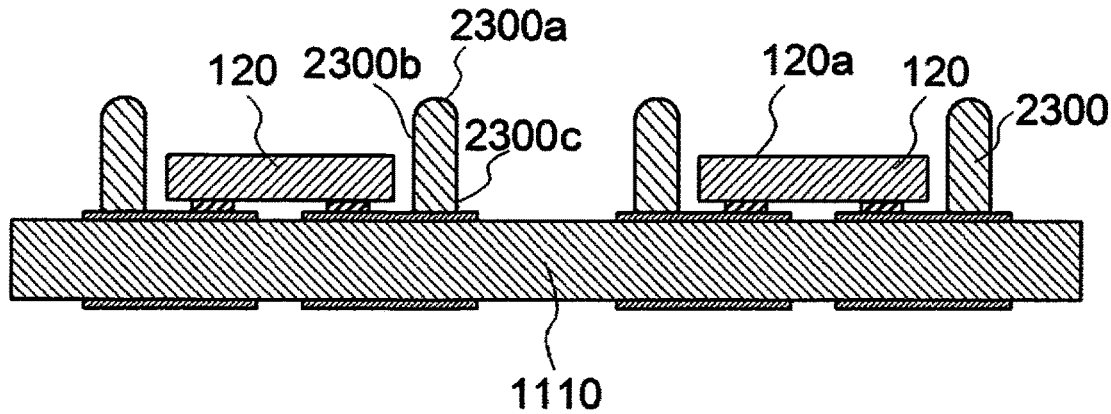
FIG. 4A is a schematic cross section view for explaining the method for manufacturing the light emitting device of the embodiment.

As shown in FIG. 4A, a frame body 2300 is formed so as to surround the light emitting element 120 placed on the top surface of the substrate 1100. The frame body 2300 is formed with a plurality of frame bodies layered, and the height is higher than that of Embodiment 1. For example, the height of a top surface 2300a of the frame body 2300 is approximately 20 μm to 120 μm higher than the height of the top surface 120a of the light emitting element 120. In the present embodiment, the frame body is explained using the same name for before deformation and after deformation.

Figure 4B:
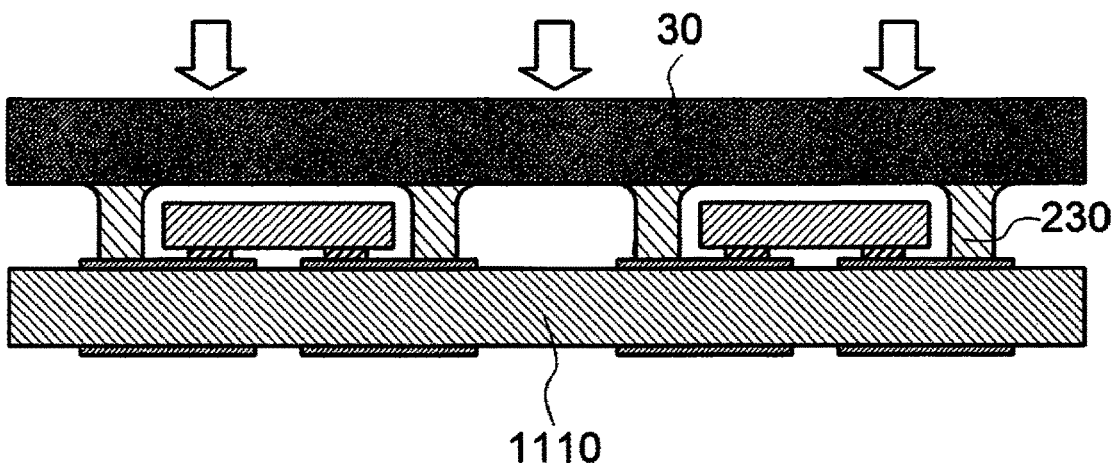
FIG. 4B is a schematic cross section view for explaining the method for manufacturing the light emitting device of the embodiment.

Next, as shown in FIG. 4B, a heated pressing member 30 deforms the frame body 2300 by pressing from above the frame body 2300. The bottom surface of the pressing member 30 is planar, and the top surface of the pressed frame body 2300 is deformed so as to be planar. Furthermore, the frame body 2300 height is lowered by being pressed, and the top part expands in the horizontal direction, in other words, to an inside surface 2300b side and an outside surface 2300c side. The parts expanded by the pressing member 30 in this way become the projecting parts 230d. The size of the projecting parts 230d (projecting amount from the side surface) can be adjusted by the height of the frame body 2300 before deformation. Depending on the deformation amount of the frame body, there are cases when the projecting parts 230d are not formed.

In this way, with Embodiment 2, because a step of deforming the frame body on the substrate is provided, there are more steps than with Embodiment 1. However, as shown in FIG. 4B, since it is possible to deform a plurality of frame bodies with one pressing member, the deformation step can be performed in a short time, so the load is small. Also, by using a frame body provided with projecting parts by deformation, it is possible to control the light emission characteristics of the light emitting device. In other words, though there are more steps, it is possible to obtain an excellent quality light emitting device.

For the pressing member 30, it is possible to use a metal plate of stainless steel, aluminum or the like, for example. For the bottom surface of the pressing member 30, in addition to the flat plane such as that shown in FIG. 4B, it is also possible to use an inclined plane or a curved surface. It is preferable that the pressing member 30 be provided with a heating mechanism on the interior. When pressing the frame body 2300, it is preferable to be set to a state heated to approximately 100° C. to 150° C. Also, for the bottom surface of the pressing member 30, to make the frame body deformed during pressing less susceptible to adhering, it is possible to do water repellent or oil repellent processing, or implement coating of a film having a mold release function.

Alternatively, it is also possible to arrange a heat resistant sheet or the like on the bottom surface of the pressing member 30, so that the pressing member 30 and the frame body are not in direct contact. When lowering the pressing member 30, so as to lower to a desired height, a spacer or the like of the same height as the frame body after deformation can be arranged between the top surface of the substrate and the bottom surface of the pressing member. As the spacer, a member that is not susceptible to deformation due to the heat of the pressing member, such as ceramic or the like, is preferable.

Figure 4C:
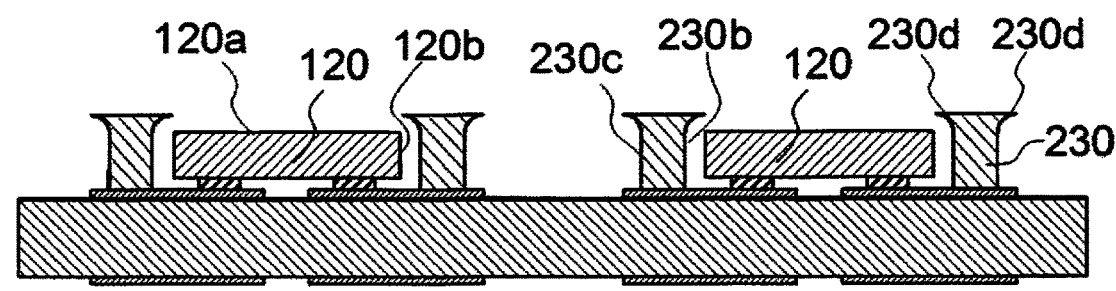
FIG. 4C is a schematic cross section view for explaining the method for manufacturing the light emitting device of the embodiment.

As shown in FIG. 4C, with the frame body 230 obtained by deforming using the pressing member, the side surface 120b of the light emitting element 120 and the inside surface 230b facing opposite that are approximately parallel. The projecting part 230d of the frame body 230 is positioned above the top surface 120a of the light emitting element 120. The projecting part 230d on the inside surface 230b side and the projecting part 230d on the outside surface 230c side are respectively projecting by the same amount.

Figure 4D:
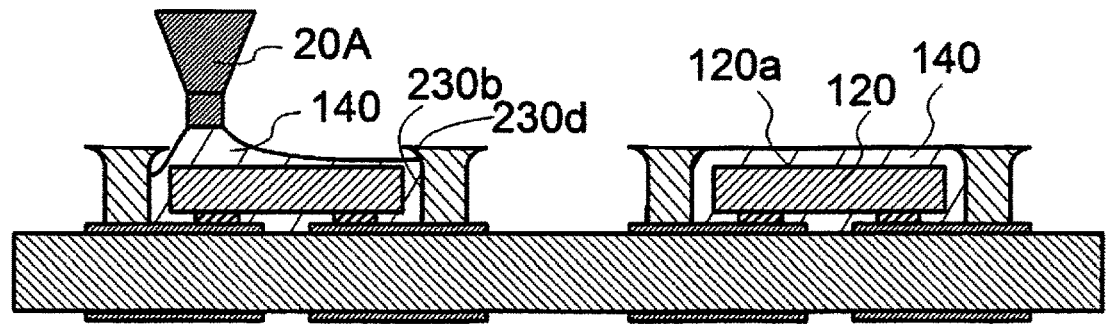
FIG. 4D is a schematic cross section view for explaining the method for manufacturing the light emitting device of the embodiment.

Next, the wavelength conversion member 140 is formed as shown in FIG. 4D. With Embodiment 2, the projecting parts 230d are provided on the top part of the frame body 230. Because of that, it is sometimes difficult to fill the uncured wavelength conversion member 140 discharged from the dispensing nozzle 20A beneath the projecting parts 230d. However, by having the bottom surface of the projecting parts 230d of the inside surface side be a curved surface, it is easier to fill the uncured wavelength conversion member 140 beneath the projecting parts 230d, so that a void or the like does not occur easily. Also, the corner of the top surface of the obtained wavelength conversion member 140 is a curved surface. It is thereby easier for the thickness of the corner parts of the wavelength conversion member 140 to be equal with that of other parts. Because of that, it is possible to reduce color unevenness.

It is possible to obtain the light emitting device 200 shown in FIG. 3 by performing the other steps in the same manner as with Embodiment 1.

Embodiment 3

Figure 5:
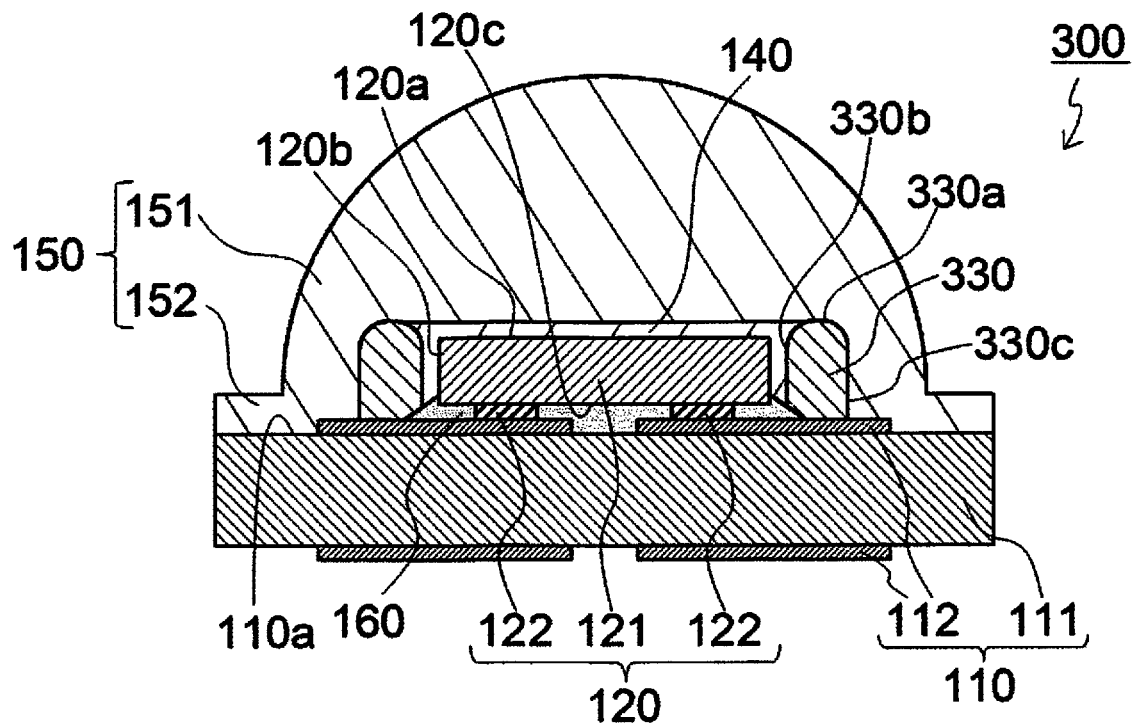
FIG. 5 is a schematic cross section view of the light emitting device obtained using the manufacturing method of an embodiment.

FIG. 5 shows a light emitting device 300 obtained using the manufacturing method of Embodiment 3. With the light emitting device 300, a light reflecting member 160 is provided between the bottom surface 120c of the light emitting element 120 and the top surface 110a of the substrate 110. The step of forming the light reflecting member 160 is performed after the step of placing the light emitting element in the manufacturing method shown in Embodiment 1 or Embodiment 2. Furthermore, the step of forming the light reflecting member 160 is preferably performed before the step of forming the frame body. By providing the light reflecting member 160, it is possible to reduce light absorption by the substrate 110. Also, when the base material 111 of the substrate 110 is ceramic, light is transmitted easily. Because of that, by the part at which the base material 111 below the light emitting element 120 is exposed being covered by the light reflecting member 160, it is easy to extract the light from the light emitting element 120 to the side and upward. The light reflecting member 160 preferably covers a part of the side surface 120b of the laminated structure 121 of the light emitting element 120.

As the light reflecting member 160, for example, it is possible to use a resin material for which a light reflective substance is dispersed in an uncured translucent resin. In this case, after placing the light emitting element 120 on the top surface 110a of the substrate 110, by supplying the uncured light reflecting member 160 using a dispensing nozzle or the like from below the side surface 120b of the light emitting element 120, arrangement can be done below the bottom surface 120c of the laminated structure 121 of the light emitting element 120. The uncured light reflecting member 160 can be supplied from below one side surface or a plurality of side surfaces of the light emitting element 120, concurrently or in sequence. When using resin material as the light reflecting member 160, it is possible to control the spread according to the viscosity, making it possible to mainly form the light reflecting member 160 below the light emitting element 120 and in the periphery of the light emitting element 120. Also, the light reflecting member 160 can be in contact with the bottom surface 120c of the light emitting element 120. It is thereby possible to make it difficult for voids or the like to be generated during formation of the wavelength conversion member 140.

It is also possible to form the light reflecting member using the electrodeposition method. For example, an intermediate body obtained by placing the light emitting element 120 on the substrate 110 provided with the conductive members 112 is immersed in an electrodeposition bath liquid containing a light reflective substance, and this is made electrically conductive. The light reflecting member in which the light reflective substance is deposited is thereby formed on the surface of the conductive members 112 of the substrate 110. When the light reflecting member is formed using the electrodeposition method in this way, the light reflecting member is formed so as to cover above the conductive members 112 and the electrodes 122 of the light emitting element 120. As the conductive members 112, for example in the case of the conductive members being configured using a material that easily absorbs light such as with the surface gold plated or the like, by covering the conductive members 112 with the light reflecting member, it is possible to reduce absorption of light from the light emitting element by the conductive members.

The light reflecting member 160 can be formed at various positions according to the forming method, such as below the light emitting element, or in its periphery, as well as above the conductive members, etc. It is also possible to form the light reflecting member at the position at which the frame body is formed. For example, with the example shown in FIG. 5, a frame body 330 is formed so as to cover a portion of the light reflecting member 160. Said another way, the outer periphery of the light reflecting member 160 is further outside than an inside surface 330b of the frame body 330, and is positioned further to the inside than an outside surface 330c of the frame body 330. The invention is not limited to this, and it is also possible for the outer periphery of the light reflecting member 160 to be positioned further outside than the outside surface 330c of the frame body 330. In this way, a part or all of the frame body 330 is formed so as to cover the light reflecting member 160, thereby making it possible to reduce the light absorbed in the base material 111 and the conductive members 112, and to be reflected on the wavelength conversion member 140. Also, the outer periphery of the light reflecting member 160 can be positioned further to the inside than the outer periphery of the lens part 151 of the translucent member 150 in the top view. Alternatively, the outer periphery of the reflecting member 160 can be positioned at the flange part 152 of the translucent member 150.

As the light reflective substance, titanium oxide, silicon oxide, zirconium oxide, potassium titanate, aluminum oxide, aluminum nitride, boron nitride, mullite or the like are suitable.

By performing the other steps in the same manner as Embodiment 1 or Embodiment 2, it is possible to obtain the light emitting device 300 shown in FIG. 5.

Embodiment 4

Figure 6:
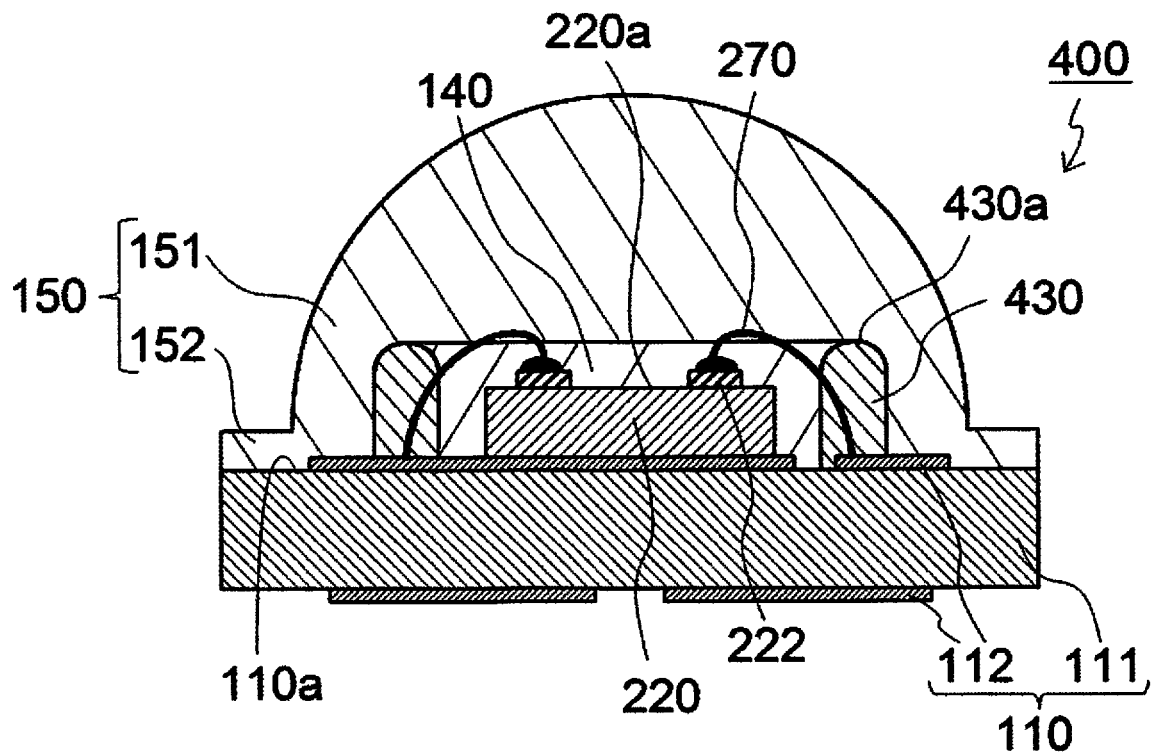
FIG. 6 is a schematic cross section view of the light emitting device obtained using the manufacturing method of an embodiment.

A light emitting device 400 obtained using the manufacturing method according to Embodiment 4 is shown in FIG. 6. The light emitting device 400 differs from Embodiments 1 to 3 in regards to the point that a light emitting element 220 is placed on the top surface 110a of the substrate 110 such that electrodes 222 are on the upper side. Because of that, the surface on the side on which the electrodes are formed is a top surface 220a of the light emitting element, and a top surface 430a of a frame body 430 is arranged at a position higher than this top surface 220a.

With Embodiment 4, to supply electricity to the light emitting element 220, the electrodes 222 of the light emitting element 220 and the conductive members 112 are connected by wires 270. The step of connecting the wires 270 is performed between the step of placing the light emitting element 220 and the step of forming the frame body 430 in the manufacturing method of Embodiments 1 to 3.

The frame body 430 can be formed above, or further to the inside, or further to the outside of the connecting part of the wires 270 and the substrate 110. In FIG. 6, an example is shown of the frame body 430 formed above the connecting part of the wires 270 and the substrate 110. In other words, a portion of the wires 270 is buried in the frame body 430. Thereby, when the coefficient of thermal expansion of a frame body 430 is small, for example, it is possible to reduce the stress on the wires 270. When sticking a molded frame body on the substrate, sticking of the substrate is done at a position for which the wires will not be deformed.

The highest part of the wire 270 can be arranged at a position higher than the top surface of the wavelength conversion member 140. In other words, a portion of the wires 270 can be buried in the translucent member 150. Thereby, when the coefficient of thermal expansion of the frame body 430 is smaller than the coefficient of thermal expansion of the wavelength conversion member 140, for example, it is possible to reduce stress on the wires 270. Alternatively, the highest part of the wires 270 can also be arranged at a position lower than the top surface of the wavelength conversion member 140. Thereby, for example, when the coefficient of thermal expansion of the wavelength conversion member 140 is small, when the temperature is high due to heat emission of the light emitting device 100 or the like, it is possible to reduce the stress on the wires 270. Also, by increasing the strength of the wavelength conversion member 140, it is possible to reduce the stress on the wires 270.

By performing the other steps in the same manner as the manufacturing method shown in Embodiment 1, it is possible to obtain the light emitting device 400 shown in FIG. 6. Also, when including the step of deforming the frame body such as shown in Embodiment 2, it is possible do deformation so as to position the top surface of the frame body 430 further upward than the highest position of the wire 270. Also, when including the step of forming the light reflecting member such as shown in Embodiment 3, using an uncured resin material before connecting the wires 270 or after connecting the wires, it is possible to form the light reflecting member on the substrate in the periphery of the light emitting element.

Embodiment 5

Figure 7:
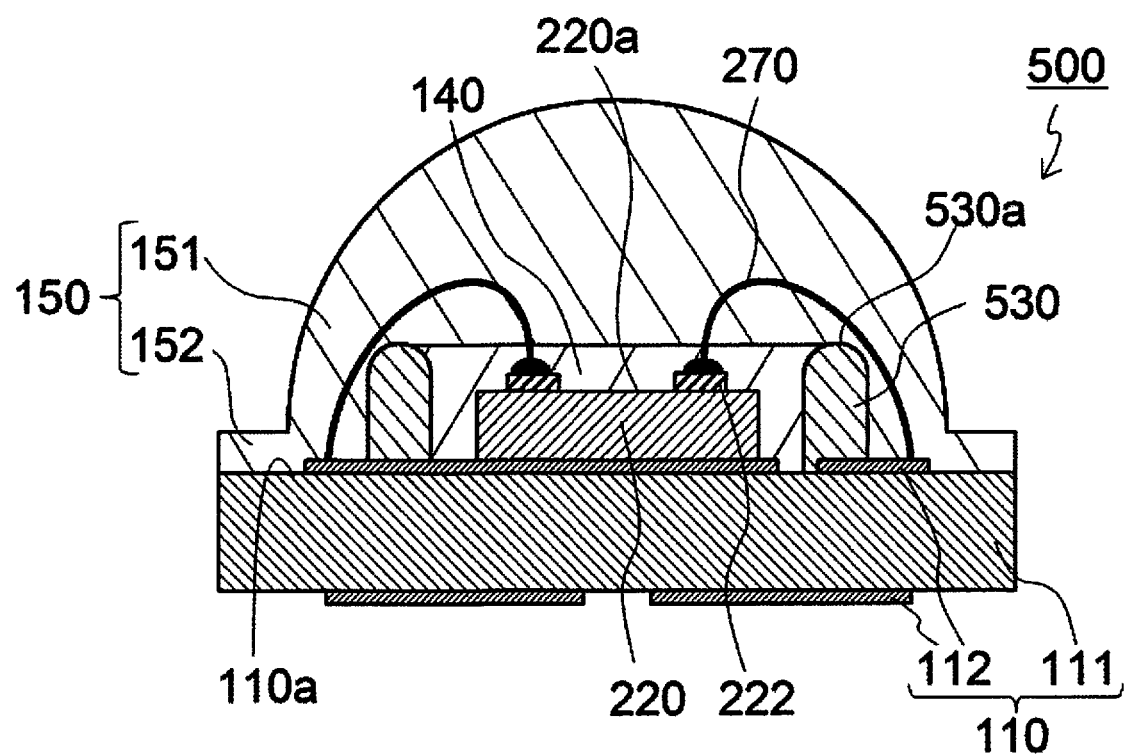
FIG. 7 is a schematic cross section view of the light emitting device obtained using the manufacturing method of an embodiment.

FIG. 7 shows a light emitting device 500 obtained with the manufacturing method according to Embodiment 5. The light emitting device 500 is the same as Embodiment 4 in regards to the point that the electrodes 222 are placed on the top surface 110a of the substrate 110 so as to be on the upper side. With Embodiment 5, the point that differs from Embodiment 4 is that in the manufacturing method shown in Embodiments 1 to 3, the step of connecting the wires 270 is provided after the step of placing the light emitting element 220 and the step of forming a frame body 530, and before the step of forming the wavelength conversion member 140.

The wires 270 connect the electrodes 222 of the light emitting element 220 and the conductive members 112 of the substrate 110 across a top surface 530a of the frame body 530. It is thereby possible to reduce the stress on the connecting part of the wires 270 and the conductive members 112 when the coefficient of thermal expansion of the frame body 530 is large.

By performing the other steps in the same manner as the manufacturing method of Embodiment 1 or 2, it is possible to obtain the light emitting device 500 shown in FIG. 7. Also, when including the step of forming the light reflecting member such as that shown in Embodiment 3, before connecting the wires 270, or after connecting the wires, it is possible to form the light reflecting member on the substrate in the periphery of the light emitting element using uncured resin material.

Following is a detailed explanation regarding the members used for each embodiment.

Substrate

The substrate is for arranging electronic components such as the light emitting element, protection element or the like, and is provided with an insulating base material, and at least one pair of conductive members formed separated from each other on the top surface of the base material. The shape of the substrate is not particularly restricted, but for example it is preferable that the top surface have a flat shape such as a square plate shape with thickness of approximately 300 μm to 500 μm. The substrate is a collective substrate until it is ultimately divided and becomes a plurality of light emitting devices. The light emitting devices obtained from one collective substrate can be suitably modified according to the size of the collective substrate or the size of the light emitting devices. For example, it is possible to have a collective substrate for which light emitting devices are arranged in a 20×20 matrix form.

As the base material of the substrate, examples include ceramic, glass epoxy resin, thermosetting resin, thermoplastic resin and the like. Ceramic is preferable, and examples include alumina, aluminum nitride and the like.

The conductive members are provided on the top surface of the substrate. They can be provided on the inside or the bottom surface of the substrate. The conductive members are used to apply voltage from an external power supply to electronic components such as the light emitting element, etc. The conductive members can be formed using a metal such as copper, aluminum, gold, silver, tungsten, iron, nickel, etc., or an iron-nickel alloy, an alloy of phosphor bronze or the like, etc. Also, to efficiently extract light from the light emitting element, the surface of the conductive members is preferably covered with a high reflectance material such as silver or gold, etc. The thickness of the conductive members is preferably approximately 5 µm to 80 µm thick, for example.

Light Emitting Element

As the light emitting element, it is preferable to use a light emitting diode. As the light emitting diode, for example, it is preferable to use an item formed with a layered structure including a light emitting layer on a translucent substrate for growth using various types of semiconductor such as a nitride semiconductor such as InN, AlN, GaN, InGaN, AlGaN, InGaAlN or the like, a group III-V compound semiconductor, or a group II-VI compound semiconductor or the like. As the substrate for growth, sapphire is preferable.

The shape of the electrodes of the light emitting element is not particularly limited, and it is possible to form the electrodes in various shapes such as an approximate square, a circle, or the like. The material for the electrodes of the light emitting element is not particularly limited.

Joining Member

The joining member is a member for electrically joining the light emitting element on the top surface of the substrate. It is possible to do so-called flip-chip mounting with which the electrodes of the light emitting element are placed on the light emitting element facing opposite the top surface of the substrate. In that case, as the joining member, an electroconductive joining member is used. Examples of the electroconductive joining member include, for example, solder materials such as Sn—Cu, Sn—Ag—Cu, Au—Sn, etc., metal bumps of gold or the like, and anisotropic conductive paste or the like.

Also, the light emitting element can also be placed on the top surface of the substrate with the electrode forming surface as the top side. In that case, for the joining member, it is possible to use the electroconductive joining member described above, or to use an insulating joining member. As the insulating joining member, examples include resin materials such as silicone resin, epoxy resin, etc.

Wires

As the wires for supplying electricity to the light emitting element, examples include electroconductive wires that use metal such as gold, silver, copper, platinum, aluminum, etc., and alloys containing at least those metals. It is particularly preferable to use wires containing a metal with excellent heat resistance, etc.

Frame Body

The frame body is a member for prescribing the region in which the wavelength conversion member is formed, and is translucent. The translucent member is formed using a member that transmits light emitted from the light emitting element. In specific terms, it is preferable to be a member that transmits 60% or more of the light emitted from the light emitting element, more preferably a member that transmits 70% or more, and even more preferably a member that transmits 80% or more, and especially preferably a member that transmits 90% or more. As this kind of member, it is possible to use a thermosetting resin or a thermoplastic resin, for example. Specific examples include resins such as silicone resin, silicone modified resin, epoxy resin, phenol resin, polycarbonate resin, acrylic resin, trimethyl pentene resin, polynorbornene resin, or a hybrid resin containing more than one of these resins.

By the frame body using the same material as the translucent member described later, it is possible to do light guiding of the light from the light emitting element and the wavelength conversion member with good efficiency in the translucent member. Alternatively, by having the index of refraction of the frame body be higher than that of the translucent member, it is possible to do light guiding with better efficiency in the translucent member. For example, it is possible to improve the light extraction efficiency by using dimethyl silicone (index of refraction 1.5) as the frame body, and by using phenyl silicone (index of refraction 1.4) as the translucent member.

Wavelength Conversion Member

The wavelength conversion member contains a phosphor which is excited by light emitted from the light emitting element and emits light of a different wavelength than the light emitted from the light emitting element, converting light from the light emitting element to a different wavelength. In addition to phosphor, the wavelength conversion member can also contain a diffusing agent, a reflective material, a binder, or a resin, etc.

The phosphor contained in the wavelength conversion member is not particularly limited as long as it is an item that is excited by light from the light emitting element, and it is preferable to use at least one or more items selected from, for example, nitride-based phosphor, oxynitride-based phosphor, or sialon-based phosphor mainly activated by lanthanoid elements such as Eu, Ce, etc.; alkaline-earth halogen apatite phosphor, alkaline-earth metal borate halogen phosphor, alkaline-earth metal aluminate phosphor, alkaline-earth silicate phosphor, alkaline-earth sulfide phosphor, alkaline-earth thiogallate phosphor, alkaline-earth silicon nitride phosphor, or germinate phosphor mainly activated by a lanthanoid element such as Eu, etc. or a transition metal element such as Mn, etc.; or a rare earth aluminate phosphor or rare earth silicate phosphor mainly activated by lanthanoid elements such as Ce, etc.; or organic and organic complexes, etc. mainly activated by lanthanoid elements such as Eu, etc.

More specifically, examples include yttrium-aluminum-garnet phosphor activated by cerium (YAG: Ce); lithium-aluminum-garnet phosphor activated by cerium (LAG: Ce); nitrogen-containing calcium aluminosilicate phosphor activated by europium and/or chrome ($CaO-Al_2O_3-SiO_2$); silicate phosphor activated by europium (($Sr, Ba)_2SiO_4$); nitride-based phosphors such as sialon phosphor, CASN phosphor, or SCASN phosphor, etc.; KSF-based phosphor ($K_2SiF_6$: Mn); and sulfur-based phosphor, quantum dot phosphor and the like. By combining these phosphors with a blue light emitting element or an ultraviolet light emitting element, it is possible to manufacture light emitting devices of various colors (a white light emitting device, for example).

The shape of the phosphor is not particularly limited, but it is preferable to be a sphere shape or a shape similar to that, for example, and in specific terms, it is preferable to be a shape having an average particle diameter of 0.1 to 100 µm, and particularly an average particle diameter of 1 to 10 µm.

With the present invention, the average particle diameter of the phosphor indicates 50% particle diameter (volume standard) when measuring the particle diameter distribution using a Coulter Multisizer II (made by Coulter Inc.) using the electrical resistance method. The electrical resistance method is a method using the correlation between the electrical resistance and particle diameter when dispersed powder passes between electrodes, so when the particles are strongly coagulated and it is difficult to disperse to primary particles, the particle diameter of coagulated secondary particles is measured.

Translucent Member

The translucent member is a member for protecting the light emitting element, etc. placed on the substrate. It is also possible to provide a lens function. The translucent member is formed using a member that transmits light emitted from the light emitting element. In specific terms, it is preferable to be a member that transmits 60% or more of the light emitted from the light emitting element, more preferably a member that transmits 70% or more, even more preferably a member that transmits 80% or more, and particularly preferably a member that transmits 90% or more. Examples of this kind of member include resins such as silicone resin, silicone modified resin, epoxy resin, phenol resin, polycarbonate resin, acrylic resin, trimethyl pentene resin, polynorbonene resin, or a hybrid resin containing more than one of these resins.

The embodiment of the present invention can be a light emitting device capable of suppressing color unevenness, and can be used for a broad range of applications such as various display devices, illumination equipment, displays, the backlight light source of a liquid crystal display, and furthermore, for image reading devices such as for facsimiles, copy machines, scanners, etc., for projector devices, and the like.

What is claimed is:

1. A method for manufacturing a light emitting device comprising:
   providing a substrate;
   placing a light emitting element on a top surface of the substrate;
   after the placing of the light emitting element, arranging on the top surface of the substrate a translucent frame body that is spaced apart from the light emitting element and that surrounds the light emitting element so that a top surface of the translucent frame body is at a position higher than a top surface of the light emitting element, and so that a distance between a side surface of the light emitting element and an inside surface of the translucent frame body is approximately equal to a difference of elevation between the top surface of the translucent frame body and the top surface of the light emitting element;
   arranging a wavelength conversion member in a region surrounded by the translucent frame body so as to cover the top surface and the side surface of the light emitting element and to be in contact with the inside surface of the frame body; and
   forming a translucent member that covers the substrate, the translucent frame body, and the wavelength conversion member, such that the translucent member is in contact with the substrate in a region outside of the translucent frame body.

2. The method for manufacturing a light emitting device according to claim 1, wherein
   the forming of the translucent frame body includes supplying an uncured resin material on the top surface of the substrate, and curing the resin material.

3. The method for manufacturing a light emitting device according to claim 2, wherein
   the forming of the translucent frame body includes deforming the uncured resin material after the supplying of the uncured resin material on the top surface of the substrate.

4. The method for manufacturing a light emitting device according to claim 3, wherein
   the deforming of the uncured resin material includes forming a projecting part at an inside surface side of the translucent frame body.

5. The method for manufacturing a light emitting device according to claim 1, wherein
   the forming of the translucent frame body includes layering a plurality of uncured resin materials on the top surface of the substrate.

6. The method for manufacturing a light emitting device according to claim 1, wherein
   the forming of the translucent frame body includes sticking a molded frame body on the top surface of the substrate.

7. The method for manufacturing a light emitting device according to claim 1, further comprising
   forming a light reflecting member below and/or in the periphery of the light emitting element.

8. The method for manufacturing a light emitting device according to claim 1, wherein
   the placing of the light emitting element on the top surface of the substrate includes placing the light emitting element having a laminated structure and a pair of electrodes so that the electrodes face the top surface of the substrate.

9. The method of manufacturing a light emitting device according to claim 1, wherein
   the arranging of the translucent frame body includes arranging the translucent frame body so that a shape of an outer periphery of the light emitting element and a shape of the inside surface of the frame body in a top view are the same shape.

10. The method of manufacturing a light emitting device according to claim 1, wherein
    the arranging of the wavelength conversion member includes
    arranging an uncured resin material of the wavelength conversion member in the region surrounded by the translucent frame body so that a top surface of the uncured resin material is at a position higher than a top surface of the translucent frame body, and
    adjusting a position of the top surface of the wavelength conversion member to be the same position as the top surface of the frame body by heating the uncured resin material.

11. The method of manufacturing a light emitting device according to claim 1, wherein
    the arranging of the wavelength conversion member includes arranging the wavelength conversion member so that a corner of the top surface of the wavelength conversion member is a curved surface.

12. The method of manufacturing a light emitting device according to claim 1, wherein
    the forming of the translucent member includes forming the translucent member having a lens part and a flange part.

13. The method of manufacturing a light emitting device according to claim 12, wherein
the forming of the translucent member includes forming the translucent member so that a height of the flange part is lower than a height of the light emitting element.

* * * * *